(12) United States Patent
Arslan

(10) Patent No.: US 8,760,212 B2
(45) Date of Patent: Jun. 24, 2014

(54) METHOD AND DEVICE FOR HIGH-SPEED GENERAL PURPOSE LEVEL-SHIFTING

(71) Applicant: Broadcom Corporation, Irvine, CA (US)

(72) Inventor: Erol Arslan, Beveren (BE)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/665,655

(22) Filed: Oct. 31, 2012

(65) Prior Publication Data

US 2014/0111266 A1   Apr. 24, 2014

Related U.S. Application Data

(60) Provisional application No. 61/715,712, filed on Oct. 18, 2012.

(51) Int. Cl.
*H03L 5/00*          (2006.01)

(52) U.S. Cl.
USPC .............................. 327/333; 326/62; 326/81

(58) Field of Classification Search
USPC ................... 326/62–63, 80–81; 327/306, 333
See application file for complete search history.

(56) References Cited

U.S. PATENT DOCUMENTS

| | | | |
|---|---|---|---|
| 6,987,412 B2 * | 1/2006 | Sutherland et al. | 327/333 |
| 7,551,035 B2 | 6/2009 | Westra et al. | |
| 7,750,718 B2 * | 7/2010 | Kim | 327/333 |
| 2012/0235728 A1 * | 9/2012 | Roth et al. | 327/333 |

* cited by examiner

*Primary Examiner* — Dinh T. Le
(74) *Attorney, Agent, or Firm* — Brinks Gilson & Lione

(57) ABSTRACT

A level shifter and method are disclosed. In one embodiment, the level shifter includes a DC biasing component connected with both an AC coupling component and a high voltage output amplifier. The AC coupling component receives an input signal from a low voltage domain and output a first voltage signal. The DC biasing component is configured to bias the first voltage signal using a bias voltage based on a previous output signal in a high voltage domain. The high voltage output amplifier is configured to amplify the DC biased voltage signal in the high voltage domain and provide an output signal in the high voltage domain.

20 Claims, 5 Drawing Sheets

METHOD AND DEVICE FOR HIGH-SPEED GENERAL PURPOSE LEVEL-SHIFTING

CROSS REFERENCES TO RELATED APPLICATIONS

This application claims the benefit of U.S. Provisional Application No. 61/715,712, entitled "Method and Device for High-speed General Purpose Level-shifting" and filed on Oct. 18, 2012, the entirety of which is incorporated herein by reference.

TECHNICAL FIELD

This disclosure relates to level-shifters used in electronic devices. More particularly, it relates to methods and devices for high-speed general purpose level-shifting.

BACKGROUND

In many electronic systems, multiple voltage supply domains are used. In general, digital electronic signals on an integrated circuit are transported using the lowest possible voltage, given the fabrication technology of the circuit. However, representations of the same signals are sometimes necessary in voltage domains of a higher supply voltage. For example, higher voltages are used in analog or mixed-signal circuits, or circuits interfacing signals to external circuits.

Therefore, a crossing between the low-voltage domain and the high-voltage may be necessary. The actual signal crossing the domain boundaries may be represented in the low-voltage domain or in the high-voltage domain depending on the direction of converting. For example, some products may use a level shifter at some point in the design to convert low-voltage (e.g. from 1.0V supply) digital signals to high-voltage signals (e.g. from 1.8V supply).

The current level-shifters, however, are typically slow. In many circuits, the inherent low speed capabilities of this circuit are a problem. Further, when a long sequence of 0 or 1 is applied, an output of the current invertor may be high or low depending on its offset at the input and will simply amplify noise. When signal starts toggle again, the output signal during that time may have excessive duty cycle distortion or glitches. This disclosure discloses new methods and devices that solve these problems.

BRIEF DESCRIPTION OF THE DRAWINGS

The innovation may be better understood with reference to the following drawings and description. In the figures, like reference numerals designate corresponding parts throughout the different views.

DETAILED DESCRIPTION

The discussion below makes reference to methods and circuit devices for high-speed general purpose level-shifting.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. While various embodiments of the invention have been described, it will be apparent to those of ordinary skill in the art that many more embodiments and implementations are possible within the scope of the invention. Accordingly, the invention is not to be restricted except in light of the attached claims and their equivalents.

Figure 1:
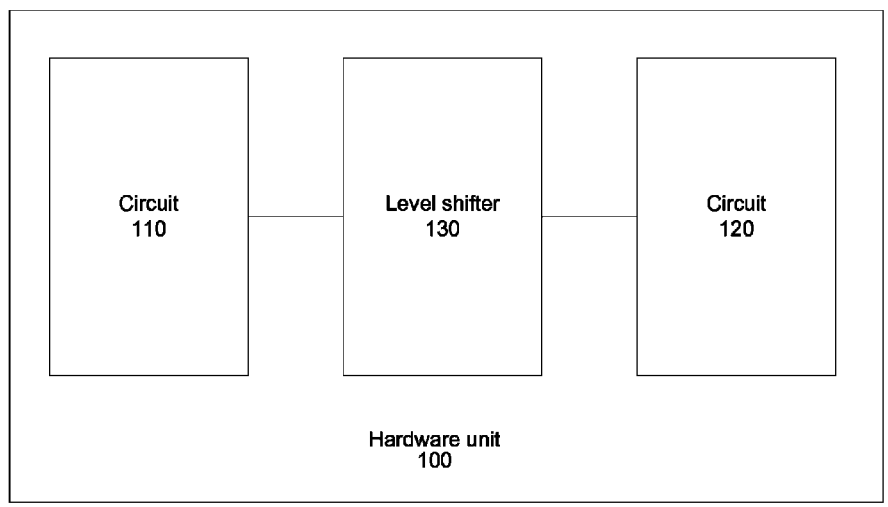
FIG. 1 illustrates an example of a hardware unit including an embodiment of a level shifter.

FIG. 1 illustrates an example of a hardware unit 100 including an embodiment of a level shifter. The hardware unit 100 includes a first circuit 110 and a second circuit 120 working in different voltage domains. The first circuit 110 and the second circuit 120 are connected via a level shifter 130. For example, the hardware unit 100 may be a cell phone, a smart phone, a laptop computer, a tablet computer, or any hardware including two circuits working in different voltage domains. The level shifter 130 is configured to transform the voltage signals between the two circuits 110 and 120.

Figure 2:
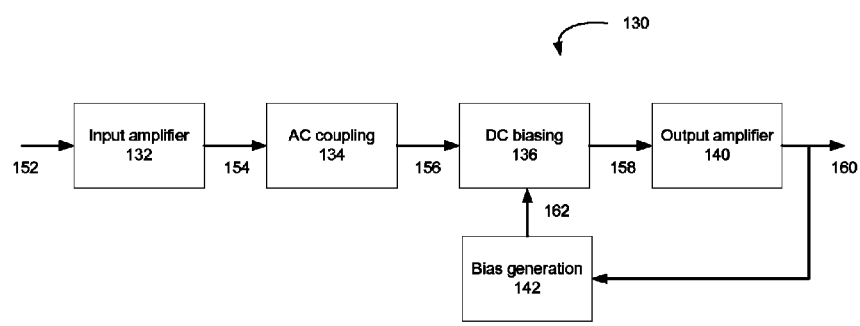
FIG. 2 illustrates an example of a high-level schematic of a circuit in accordance with one embodiment of the level shifter in FIG. 1.

FIG. 2 illustrates an example of a high-level schematic of a circuit in accordance with one embodiment of the level shifter 130 in FIG. 1. In FIG. 2, the example level shifter 130 includes an input amplifier 132 configured to amplify an input voltage signal 152 in a first voltage domain. The amplified signal 154 of the input amplifier 132 is then input to an AC coupling circuit component 134 connected with the input amplifier 132. The AC coupling circuit component 134 is configured to receive the amplified signal 154 from the first voltage domain and output a first voltage signal 156. The AC coupling circuit component 134 is connected with a DC biasing circuit component 136. The DC biasing circuit component 136 is also connected with a high voltage output amplifier 140 and a bias generation component 142.

The high voltage output amplifier 140 is configured to amplify the DC biased voltage signal 158 in a second voltage domain and provide an output signal 160 in the second voltage domain. The bias generation component 142 is configured to generate a bias voltage 162 for the DC biasing circuit component 136 based on the output signal 160. In an embodiment, the first voltage domain is a low voltage domain and the second voltage domain is a high voltage domain that has a greater maximum operating voltage than the low voltage domain. In another embodiment, the first voltage domain is a high voltage domain and the second voltage domain is a low voltage domain that has a less maximum operating voltage than the high voltage domain.

The bias generation component 142 may include a delay unit and thus the bias voltage 162 applied to the DC biasing circuit component 136 is based on the last received input voltage signal 152 and the last output voltage signal 160. For example, the DC biasing circuit component 136 may take an output from the bias generation component 142 as its bias voltage 162. The bias voltage 162 is based on a previous output signal 160 in a high voltage domain from the output amplifier 140.

Figure 3:
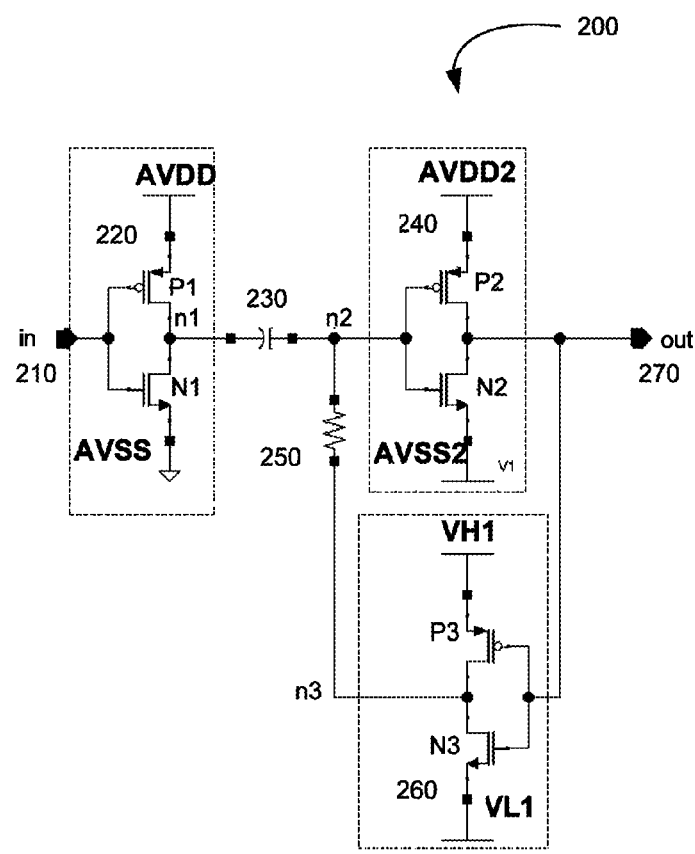
FIG. 3 illustrates an example embodiment of a level shifter.

FIG. 3 illustrates an example embodiment of a level shifter 200. In FIG. 3, the level shifter 200 receives an input signal 210 in a low voltage domain and outputs an output signal 270 in a high voltage domain. The input amplifier 220 includes a PMOS P1 and an NMOS N1. The output of the input amplifier 220 is connected with an AC coupling circuit that includes a capacitor 230. The AC coupled signal is connected with the DC biasing component that includes a resistor 250. The resistor 250 is connected with a DC biasing generation component 260 which provides a varying DC biased voltage signal based on the output signal 270.

The DC biased voltage signal is then input to the output amplifier 240 connected with the capacitor 230 and the resistor 250. The output amplifier 240 includes a PMOS P2 and an NMOS N2. The DC biasing generation component 260 includes a PMOS P3 and an NMOS N3. The voltage supply AVDD to the input amplifier 220 is usually lower than the voltage supply AVDD2 to the output amplifier 240. The voltage supply VH1 to the DC biasing generation component 260 may be the same as the voltage supply AVDD2. For example, both VH1 and AVDD2 may be 3.3V in an embodiment. The grounds AVSS and AVSS2 may different. In an embodiment, AVDD is about 1V and AVSS is about 0V while AVDD2 is about 3.3V and AVSS2 is about 2.3V.

In an embodiment, the disclosed level shifter 200 works even if long sequence of 0 or 1 are received. This is achieved by biasing the AC couple cap based on the last received bit. The DC biasing generation component 260 forms a latch while the feedback invertor is very weak and only serves to not allow the capacitor 230 to discharge. For example, the feedback invertor circuit works if the input swing VPP1, which equals to AVDD-AVSS, is able to make always signal change with other invertors between AVDD2 and VL1. Supply and ground of input and output invertors are fully independent.

In an embodiment, VH1 and VL1 may be chosen such that AC couple cap is never discharged so much that node n2 reaches the trip-point $V_{TH}$ of the output invertor between AVDD2/AVSS2. In an embodiment, the trip-point $V_{TH}$ is 2.3V. For example, VH1 is chosen to be greater than $V_{TH}$ and VL1 is chosen to be less than $V_{TH}$. The voltage supply VL1 may be in the range of 0V to 2.3V. The voltage supply VH1 may be in the range of 1V to 3.3V.

In an embodiment, the input swing VPP1 equals to AVDD-AVSS, the output swing VPP2 equals to AVDD2-AVSS2. VPP1 may be greater or less than VPP2. For example, VPP1 is between 1V to 2V and VPP2 is between 1V to 2V. In an embodiment, VPP1 may be 1V and VPP2 may be 1.8V. When a transition occurs at input of the AC couple cap, the trip-point $V_{TH}$ of the output invertor is reached. In other words, if VL1 is too low or VH1 is too high, when the input makes a new transition, the signal at node n3 on the AC couple cap output may never reach the trip point $V_{TH}$ of the output invertor. Thus, VL1 is greater than $V_{TH}$–VPP and VH1 is less than $V_{TH}$+VPP. For example, when AVDD=1V, AVSS=0V, AVDD2=3.3V, AVSS2=2.3V, VH1=3.3, VL1=2.3V, $V_{TH}$ is about 2.8V. Accordingly, VL1 is between 1.8V and 2.8V and VH1 is between 2.8V and 3.8V.

In an embodiment, AVDD is about 1V. AVSS is about 0V. AVDD2 is about 3.3V. AVSS2 is about 2.3V. VH1 is about 3.3V. VL1 is about 2.3V. The trip-point $V_{TH}$ for invertor depends on PMOS/NMOS sizing but typically will be halfway the power supplies. For example, the $V_{TH}$ may be about 2.8V.

Figure 4:
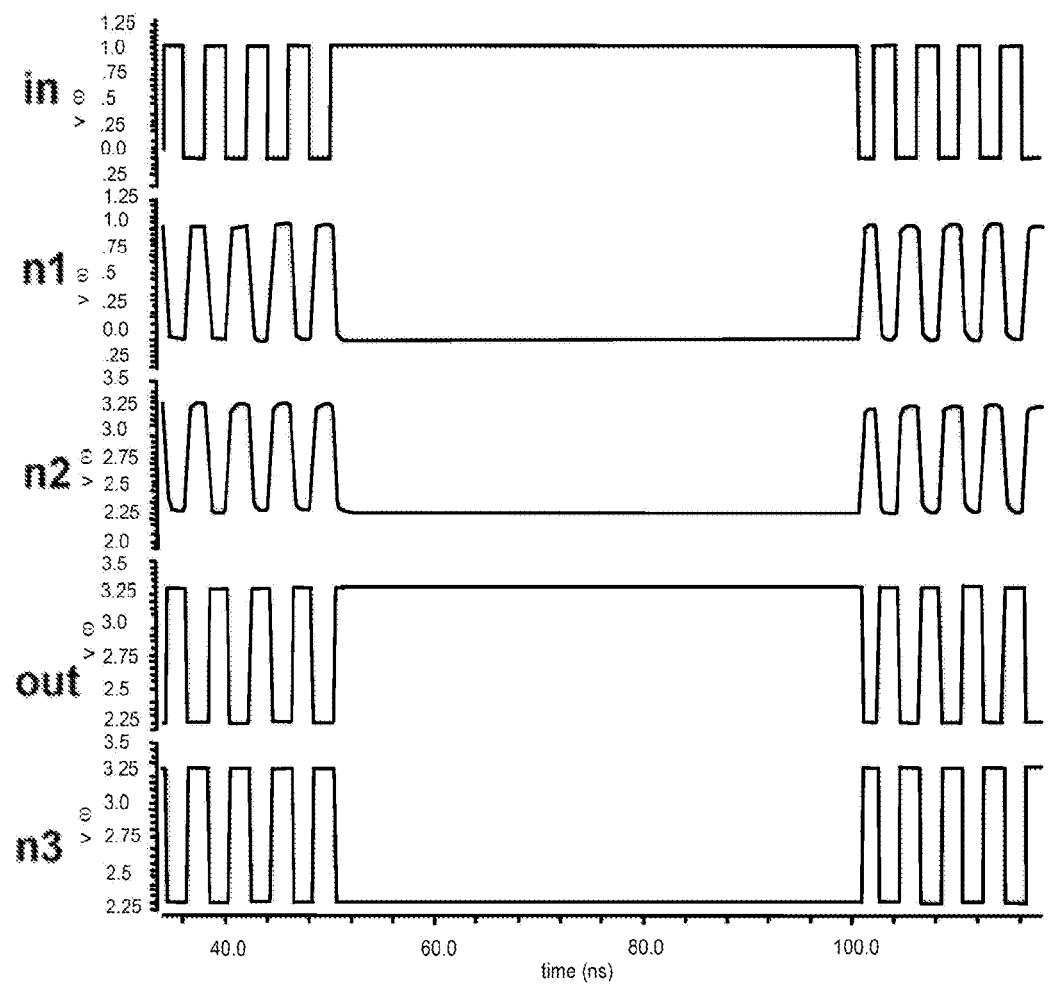
FIG. 4 illustrates a simulation diagram in accordance with the example embodiment of a level shifter of FIG. 3.

FIG. 4 illustrates a simulation diagram in accordance with the example embodiment of a level shifter of FIG. 3. Using the level shifter 200 in FIG. 3, the bias node n3 moves along with the signal at node n2, which is the input of the output amplifier 240. The delay introduced by the two invertors between n2 and n3 may not be long relative to the RC time constant. This way, the two nodes n2 and n3 are at the same potential and the bias resistor 250 does not carry any (discharge) current. Thus, the AC couple cap discharge problem of the prior art AC coupled level shifter is solved.

Figure 5:
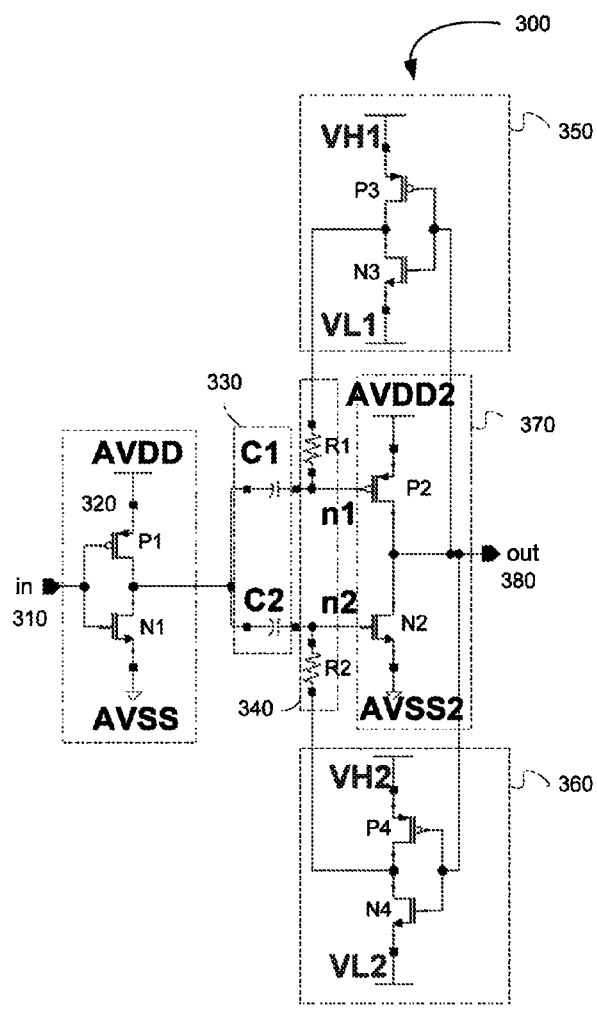
FIG. 5 illustrates another example embodiment of a level shifter.

FIG. 5 illustrates another example embodiment of a level shifter 300. In FIG. 4, the level shifter 300 receives an input signal 310 in a low voltage domain and outputs an output signal 380 in a high voltage domain. The input amplifier 320 includes a PMOS P1 and an NMOS N1. The output of the input amplifier 220 is connected with an AC coupling circuit 330 that includes a first capacitor C1 and a second capacitor C2. The AC coupled signal is connected with the DC biasing component 340 that includes a first resistor R1 and a second transistor R2.

The first resistor R1 is connected with a first DC biasing generation component 350 which provides a first varying DC biased voltage signal based on the output signal 380. The second resistor R2 is connected with a second DC biasing generation component 360 which provides a second varying DC biased voltage signal based on the output signal 380. The first DC biasing generation component 350 includes a PMOS P3 and an NMOS N3. The PMOS P3 is supplied with a voltage VH1 and the NMOS N3 is supplied with a voltage VL1. The second DC biasing generation component 360 includes a PMOS P4 and an NMOS N4. The PMOS P4 is supplied with a voltage VH2 and the NMOS N4 is supplied with a voltage VL2.

The first and second DC biased voltage signals at nodes n1 and n2 are the input to an output amplifier 370 that includes a PMOS P2 and an NMOS N2. The first DC biased voltage signal at node n1 is connected with the PMOS P2. The second DC biased voltage signal at node n2 is connected with the NMOS N2. The PMOS P2 is supplied with a voltage signal AVDD2 and the NMOS N2 is supplied with a voltage signal AVSS2.

In an embodiment, the first and second DC biasing generation components 350 and 360 work as invertors. Thus, the bias voltage applied on the transistors R1 and R2 may be pulled by the invertors and high-R resistance to an appropriate ON or OFF bias voltage. For example, the ON/OFF voltages in FIG. 4 may be VH1/VL1 and VH2/VL2.

In an embodiment, the possible ranges VH1, VL1, VH2, VL2 are determined by the trip-point of the invertors corresponding to the first and second DC biasing generation component 350 and 360. However, the trip-point of the invertor is set by separate voltages VTHP for PMOS P2 and VTHN for the NMOS N2 of the output amplifier 370. Thus, when V(n1) equals to VTHP and V(n2) equals to VTHN, the invertor is exactly midway at its trip-point. In that case, the possible ranges for VH1, VL1, VH2, VL2 may need to meet the following conditions: VH1>VTHP, VL1<VTHP, VH2>VTHN, and VL2<VTHN.

For example, AVDD is about 1V. AVSS is about 0V. AVDD2 is about 3.3V. AVSS2 is about 0V. VH1 is about 3.3V. VL1 is about 2.3V. VH2 is about 1V. VL2 is about 0V. VTHP and VTHN may be selected depending on PMOS/NMOS sizes and a maximum crowbar current. For instance, VTHP may be about 2.8V and VTHN may be about 0.5V.

In another example, AVDD is about 1.8V. AVSS is about 0V. AVDD2 is about 3.3V. AVSS2 is about 2.3V. VH1 may be chosen between about 2.8V and 4.6V. VL1 may be chosen between about 1V and 2.8V. VH2 is about 1V. VL2 is about 0V.

Figure 6:
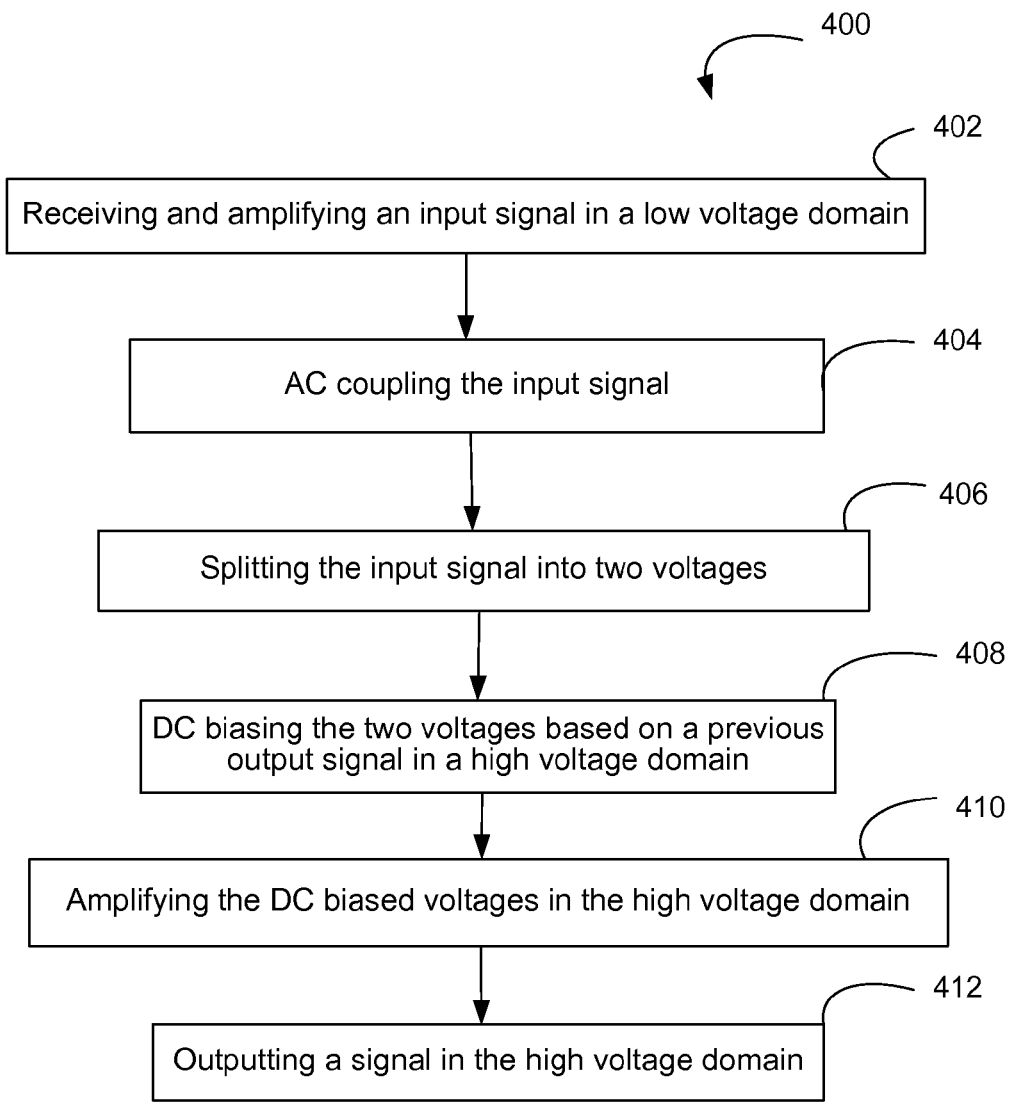
FIG. 6 illustrates an example of a block diagram of a method in accordance with embodiments of a level shifter.

FIG. 6 illustrates an example of a block diagram of a method 400 in accordance with embodiments of a level shifter. In this method, an input signal in a first voltage domain is received and amplified (402). The first voltage domain may be a low voltage domain or a high voltage domain. For example, this may be accomplished using an input amplifier disclosed above. Alternatively, if the circuit driving the input signal is powerful enough to drive an AC coupling circuit directly, then this step may be unnecessary.

The low-voltage signal is then AC coupled (404). This step may be accomplished using an AC coupling component disclosed above. In step, the AC coupled signal is split into two voltages. Steps 404 and 406 may be accomplished using an AC coupling circuit including two capacitors which may be charged to a predetermined voltage.

The two voltages are then DC biased base on a previous output signal in a second voltage domain (408). The second voltage domain is different from the first voltage domain. For example, the second voltage domain is a high voltage domain when the first voltage domain is a low voltage domain. The second voltage domain may be a low voltage domain when the first voltage domain is a high voltage domain. The previous output signal may correspond to a previous input signal in the low voltage domain. And the high voltage domain may have a greater maximum operating voltage than the low voltage domain. This step may be accomplished using a DC biasing component connected with a bias generation component disclosed above. The bias generation component may include a PMOS and an NMOS. Alternatively, this step may be accomplished using an invertor with slightly different design.

The DC biased signal is amplified in the high voltage domain (410). This step may be accomplished using an output amplifier disclosed above. The output amplifier may also provide a feedback to the bias generation component so that an appropriate ON or OFF voltage is supplied to a resistor in the DC biasing component.

An output signal in the high voltage domain is output (412). This step may be accomplished using an output amplifier including two transistors, each of which is connected with a capacitor of the AC coupling circuit.

The methods, circuit devices, and logic described above may be implemented in many different ways in many different combinations of hardware, software or both hardware and software. For example, all or parts of the apparatus may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. While various embodiments of the disclosure have been described, it will be apparent to those of ordinary skill in the art that many more embodiments and implementations are possible within the scope of the disclosure. Accordingly, the disclosure is not to be restricted except in light of the attached claims and their equivalents.

What is claimed is:

1. A circuit, comprising:
an alternating current (AC) coupling component configured to receive an input signal from a low voltage domain and output a first voltage signal;
a direct current (DC) biasing component, connected with the AC coupling component, configured to bias the first voltage signal using a bias voltage based on a previous output signal in a high voltage domain; and
a high voltage output amplifier, connected with the DC biasing component, configured to amplify the DC biased voltage signal in the high voltage domain and provide an output signal in the high voltage domain,
wherein the high voltage domain has a greater maximum operating voltage than the low voltage domain,
wherein the AC coupling component comprises: a first capacitor and a second capacitor, and
wherein the DC biasing component comprises: a first resistor connected with the first capacitor; and a second resistor connected with the second capacitor.

2. The circuit of claim 1, further comprising: a DC bias generation component, connected with the DC biasing component, configured to generate the bias voltage based on the previous output signal.

3. The circuit of claim 2, wherein the DC bias generation component comprises an invertor configured to receive the output signal in the high voltage domain.

4. The circuit of claim 2, wherein the DC bias generation component comprises an invertor having a plurality of voltage supplies in the high voltage domain.

5. The circuit of claim 1, further comprising: a low voltage input amplifier, connected with the AC coupling component, configured to amplify the input signal in the low voltage domain.

6. The circuit of claim 1, wherein the high voltage output amplifier comprises: a first transistor connected with the first capacitor; and a second transistor connected with the second capacitor.

7. The circuit of claim 2, wherein the bias generation component further comprises a delay unit to delay the output voltage.

8. The circuit of claim 2, wherein the high voltage output amplifier comprises a PMOS transistor and an NMOS transistor.

9. A circuit, comprising:
an alternating current (AC) coupling component configured to split an input signal from a low voltage domain into a first voltage signal and a second voltage signal;
a direct current (DC) biasing component configured to bias the first voltage signal with a first varying DC voltage to provide a first DC biased voltage signal and to bias the second voltage signal with a second varying DC voltage to provide a second DC biased voltage signal; and a high voltage output amplifier, connected with the DC biasing component, configured to amplify the first DC biased voltage signal and the second DC biased voltage signal in a high voltage domain to provide an output signal in the high voltage domain;

wherein the high voltage domain has a greater maximum operating voltage than the low voltage domain.

10. The circuit of claim 9, further comprising: a first and second DC bias generation components, connected with the DC biasing component, configured to generate the first and second varying DC voltages based on the previous output signal.

11. The circuit of claim 9, wherein the first and second DC bias generation components respectively comprises a first invertor and a second invertor configured to invert the previous output signal.

12. The circuit of claim 11, wherein the first invertor has a first plurality of voltage supplies in the high voltage domain and the second invertor has a second plurality of voltage supplies in the low voltage domain.

13. The circuit of claim 9, further comprising: a low voltage input amplifier, connected with the AC coupling component, configured to amplify the input signal in the low voltage domain.

14. The circuit of claim 9, wherein the AC coupling component comprises: a first capacitor and a second capacitor.

15. The circuit of claim 14, wherein the DC biasing component comprises: a first resistor connected with the first capacitor; and a second resistor connected with the second capacitor.

16. The circuit of claim 14, wherein the high voltage output amplifier comprises: a first transistor connected with the first capacitor; and a second transistor connected with the second capacitor.

17. A circuit, comprising:
an alternating current (AC) coupling component configured to split an input signal into a first voltage signal and a second voltage signal;

a direct current (DC) biasing component configured to bias the first voltage signal with a first DC voltage to provide a first varying DC biased voltage signal and to bias the second voltage signal with a second varying DC voltage to provide a second DC biased voltage signal, the DC biasing component comprising:

a first P-type metal-oxide-semiconductor(PMOS) transistor coupled with a first N-type metal-oxide-semiconductor(NMOS) transistor and being provided with a first predetermined voltage; and a second PMOS transistor connected with a second NMOS transistor being provided with a second predetermined voltage; wherein the first predetermined voltage is greater than the second predetermined voltage; and a first voltage output amplifier, connected with the DC biasing component, configured to amplify the first DC biased voltage signal and the second DC biased voltage signal in a first voltage domain to provide an output signal in the first voltage domain.

18. The circuit of claim 17, further comprising:
a second voltage input amplifier, connected with the AC coupling component, configured to amplify the input signal in the second voltage domain, wherein the AC coupling component comprises: a first capacitor and a second capacitor.

19. The circuit of claim 18, wherein:
the first PMOS transistor and the first NMOS transistor are connected with a first resister connected with the first capacitor, and the second PMOS transistor and the a second NMOS transistor are connected with a second resister connected with the second capacitor.

20. The circuit of claim 17, wherein the first NMOS transistor is provided with a third predetermined voltage that is less than the second predetermined voltage.

* * * * *

UNITED STATES PATENT AND TRADEMARK OFFICE
CERTIFICATE OF CORRECTION

PATENT NO.        : 8,760,212 B2                                    Page 1 of 1
APPLICATION NO.   : 13/665655
DATED             : June 24, 2014
INVENTOR(S)       : Erol Arslan It is certified that error appears in the above-identified patent and that said Letters Patent is hereby corrected as shown below:

In the Claims

In column 8, claim 19, line 30, after "PMOS transistor and the" delete "a".

Signed and Sealed this
Third Day of March, 2015

Michelle K. Lee
*Deputy Director of the United States Patent and Trademark Office*